(12) United States Patent
Aipperspach et al.

(10) Patent No.: US 6,260,164 B1
(45) Date of Patent: Jul. 10, 2001

(54) SRAM THAT CAN BE CLOCKED ON EITHER CLOCK PHASE

(75) Inventors: Anthony Gus Aipperspach; Leland Leslie Day; Paul Allen Ganfield; Charles Luther Johnson, all of Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/127,355

(22) Filed: Jul. 31, 1998

(51) Int. Cl.$^7$ ............................. G01R 31/28; G06F 1/04
(52) U.S. Cl. ...................... 714/726; 714/734; 713/600
(58) Field of Search .................................. 714/726, 727, 714/729, 731, 733, 734, 811, 814, 718, 30; 713/400, 600

(56) References Cited

U.S. PATENT DOCUMENTS

| | | | |
|---|---|---|---|
| 4,441,075 | 4/1984 | McMahon | 714/731 |
| 4,669,061 | 5/1987 | Bhavsar | 365/154 |
| 4,780,874 | 10/1988 | Lenoski et al. | 714/726 |
| 4,893,072 | 1/1990 | Matsumoto | 714/731 |
| 4,894,830 * | 1/1990 | Kawai | 714/731 |
| 4,926,424 | 5/1990 | Maeno | 714/719 |
| 5,018,144 | 5/1991 | Corr et al. | 714/731 |
| 5,127,008 | 6/1992 | Bassett et al. | 714/726 |
| 5,130,647 | 7/1992 | Sakashita et al. | 714/731 |
| 5,325,367 * | 6/1994 | Dekker et al. | 714/718 |
| 5,440,569 | 8/1995 | Naito | 714/726 |
| 5,471,481 * | 11/1995 | Okumoto et al. | 714/727 |
| 5,640,402 | 6/1997 | Motika et al. | 714/731 |
| 5,793,778 * | 8/1998 | Qureshi | 714/727 |

* cited by examiner

Primary Examiner—Christine T. Tu
(74) Attorney, Agent, or Firm—Merchant & Gould; James R. Nock

(57) ABSTRACT

A functional unit, such as an SRAM, in a single clock chip design that contains a scan path can be clocked on either rising edge and falling edge of the clock. The functional unit includes a clock signal having two phases and a plurality of latches for scanning. Two scan latches are added outside the array of the functional unit. In one clock phase, the two scan latches form a latch pair which is connected to the array at Scan-in side. In the other clock phase, one scan latch is connected to the array at the Scan-in side, and the other scan latch is connected to the array at the Scan-out side. In scan/hold operations, a first control signal for the array which is clocked at the falling edge of the clock leads a second control signal for the array which is clocked at the rising edge of the clock. In ABIST/functional operations, the first control signal for the array which is clocked at the falling edge of the clock trails the second control signal for the array which is clocked at the rising edge of the clock.

13 Claims, 11 Drawing Sheets

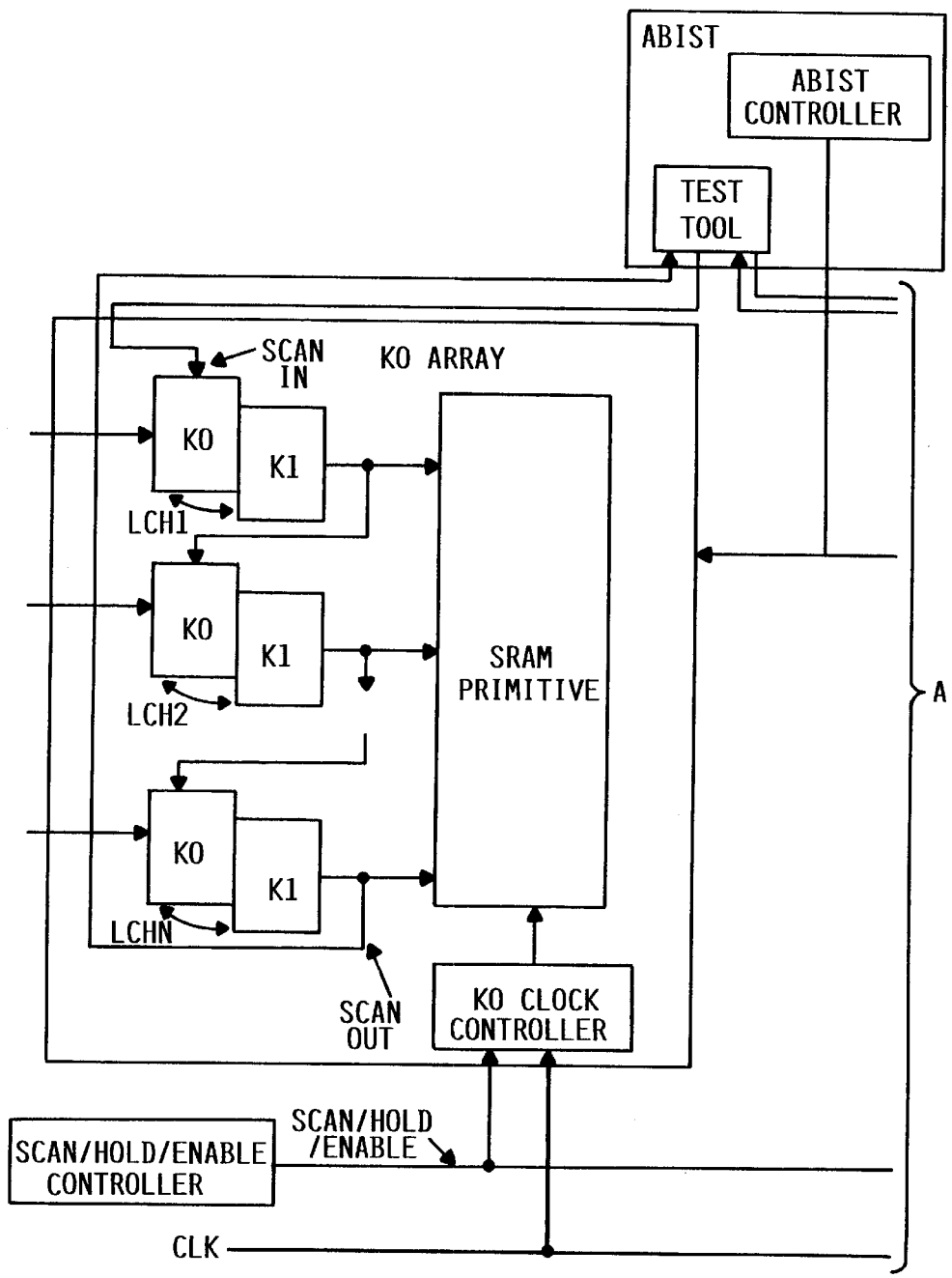
FIGURE IA

SRAM THAT CAN BE CLOCKED ON EITHER CLOCK PHASE

FIELD OF THE INVENTION

The present invention relates generally to a functional unit in a single clock chip design that contains a scan path. More particularly, the present invention relates to an SRAM in a single clock chip design that contains a scan path which can be clocked on either rising edge or falling edge of the clock.

BACKGROUND OF THE INVENTION

In designing large scale integration (LSI) circuits or very large scale integration (VLSI) circuits, one important step is to incorporate testing circuits for the designs. The principle is to proceed testing methods concurrently with the architectural considerations of the designs as opposed to be left until fabricated chip or components of the chip have been made. This manufacturing test principle has been well recognized by the LSI and VLSI design industry.

The testing of large scale integration (LSI) packages, very large scale integration (VLSI) packages, and application-specific integrated circuits (ASIC) has become increasingly important as these components and circuits continue to increase in gate densities. One existing built-in self-test system is called Array Built-In Self-Test (ABIST). ABIST is accomplished using an ABIST controller which sends address and data to all the arrays of functional logic units and receives output data from the arrays at the same time via scanning. The outputted data is compared with the expected data so as to determine the accuracy of the chip design and the performance thereof. The ABIST controller does not differentiate or compensate for the different arrays which are clocked in different phases, i.e. clocked at the rising edge or at the falling edge.

In a single clock chip design, depending upon the functional requirements of the chip design, a functional array, such as an SRAM, needs to be clocked on different phases of the clock, for example, a Dcache array and an Icache array. The Dcache may be clocked in one phase of the clock (e.g. the rising edge of the clock), and the Icache may be clocked in the other phase of the clock (e.g. the falling edge of the clock). Accordingly, the two arrays are generally the same except their clock phases.

In addition, the SRAM is designed to be tested by the ABIST. In general, the SRAM includes a primitive SRAM (pure SRAM logic) and a set of scan latches at the input and output of the SRAM array. These latches are used for the ABIST test. The ABIST sends scan data to the scan latches during a test. The scan latches are arranged in a scan chain or scan ring and configured by a plurality of latch pairs K0/K1. In general, the K0 latch and K1 latch are the same except that they latch their input data at different edge of the clock. The K0 latch is latched at the rising edge of the clock, i.e. the scan data is latched by the K0 latch at the rising edge of the clock. The K1 latch is latched at the falling edge of the clock, i.e. the scan data is latched by the K1 latch at the falling edge of the clock. In a normal clock cycle (i.e. CLK), the K0 latch latches a half cycle ahead of the K1 latch, i.e. the latch pair being in an order of K0/K1. Alternatively, in a clock cycle −CLK, the K0 latch latches a half cycle behind the K1 latch, i.e. the latch pair being in an order of K1/K0.

In a traditional single clock chip design, an SRAM clocked at the rising phase of the clock (e.g. Dcache array) is referred to K0 array, and an SRAM clocked at the falling phase of the clock (e.g. Icache array) is referred to K1 array. FIG. 1 illustrates the K0 and K1 arrays. The ABIST sends Scan-In data to the K0 and K1 arrays and receives Scan-Out data from the K0 and K1 arrays. For the purpose of illustration, scan latch pairs K0/K1 (LCH1, LCH2, ... LCHN) are only shown at the input of the K0 and K1 arrays. In general, the scan latch pairs K0/K1 are also connected to the output of the K0 and K1 arrays. As mentioned above, the K0 and K1 arrays are identical except their clock phase, K0 array being clocked at the rising edge of the clock, and the K1 array being clocked at the falling edge of the clock. Therefore, to reduce the design complication and cost, there is a need to design a scannable, single array which can be clocked on either phase of the clock so as to satisfy functional requirements for different types but identical arrays (e.g. Dcache and Icache). However, as mentioned above, to simply invert the clock (i.e. −CLK) into a single array to obtain the second type of array (i.e. K1 array) would reverse the scan latch pairs K0 and K1 (i.e. in an order of K1/K0) in the array. The reverse of K0/K1 scan latches causes latch phase problems in interfacing outside the array. Specifically, the array driven by CLK has a latch phase K0/K1—K0/K1 in interfacing outside the array (the first K0/K1 pair is outside the array, and the second K0/K1 is inside the array). However, the array driven by −CLK has a latch phase K0/K1—K1/K0 in interfacing outside the array. This type of latch phase discontinuance cannot be tolerated in a chip design. Therefore, traditionally, two similar arrays are designed for an SRAM to satisfy functional requirements, for example Dcache and Icache. As a result, it requires extra design effort and cost. Further, the resource for designing the SRAM increases significantly.

In addition, as mentioned above, the scan latches K0 and K1 in a latch pair are the same except that they latch data at different phase of the clock. By simply inverting the clock into the array to obtain the second type of array (i.e. K1 array), the scan latches K0/K1 are made backwards, i.e. the K0 latch is clocked at the falling edge of the clock, and the K1 latch is clocked at the rising edge of the clock. Since the ABIST is generally not designed to compensate for the changes due to the changes of K0/K1 latch pair, the scan may not be accomplished by using a single controller which sends address and data to all the arrays and receives output data from the arrays at the same time via scanning. As a result, similar arrays are designed for the ABIST. FIG. 1 shows scan paths of two similar K0,K1 arrays in a traditional single clock chip design. The ABIST controls both K0 and K1 arrays. In each of the K0 and K1 arrays, latch pairs LCH1, LCH2, ... LCHN are arranged in an order of K0/K1. The test tool of the ABIST sends the Scan-in data to the K0,K1 arrays and receives the Scan-out data from the K0,K1 arrays. In addition, a scan/hold/enable controller determines whether the arrays are under a scan mode or a functional mode. FIG. 1 only shows the scan path of the arrays. Further, a clock controller controls the free-running clock CLK and determines which array(s) should be activated for operations such as a scan operation or a functional operation, etc.

Therefore, there is a need to design a scannable, single array which can be clocked on either clock phase. There is also a need to design an improved SRAM which can be clocked on either clock phase so as to satisfy functional requirements, e.g. Dcache and Icache. The present invention provides a solution to the above and other problems and offers other advantages over the prior art.

SUMMARY OF THE INVENTION

The present invention relates generally to a functional unit in a single clock chip design that contains a scan path. More particularly, the present invention relates to an SRAM in a single clock chip design that contains a scan path which can be clocked on either rising edge or falling edge of the clock.

In one embodiment of the present invention, a functional unit, such as an SRAM, includes a clock signal and a plurality of latches for scanning that can be clocked on either phase of the clock signal.

Still in one embodiment, a positive or negative clock signal is chosen as input to an array which is referred to as K array having scan latches R0/R1. If the clock signal is positive (i.e. CLK), the scan latches R0/R1 of the K array are the same as and function in an order of K0/K1 latch pairs of the traditional K0 array. If the clock signal is negative (i.e. −CLK), the scan latches R0/R1 of the K array function in an order of K1/K0 latch pairs which are the same as K1/K0 latch pairs while simply inverting the clock CLK. For comparison and illustration, K0 and K1 latches are marked in ( ). In the array which is clocked at the rising edge of the clock, the scan latches are R0/R1 (i.e. K0/K1). In the array which is clocked at the falling edge of the clock, the scan latches are R0/R1 (i.e. K1/K0).

Further in one embodiment of the present invention, two scan latches K0 and K1 are added outside the array. For the K array which is clocked at the rising edge of the clock, the two added scan latches form a scan latch pair K0/K1 (LCH1). The Scan-in data to the K array is from the output of the K1 latch of the latch pair K0/K1 (LCH1). For the K array which is clocked at the falling edge of the clock, one of the two scan latches KO is connected to the array at the Scan-in side, and the other scan latch K1 is connected to the array at the Scan-out side. The Scan-in data to the K array is from the output of the added K0 latch. The latch pair arrangement for LCH1 is still K0/K1 wherein the K0 is the added K0 latch, and the K1 is the R0 (K1) latch of the first scan latch pair R0/R1 (K1/K0) at the input of the K array. The Scan-out data from the K array is outputted to the other added scan latch, i.e. the K1 latch. Accordingly, the LCHN arrangement is still K0/K1 wherein K0 is the R1 (K0) latch of the last scan latch pair R0/R1 (K1/K0) at the output of the K array, and the K1 is the added K1 latch. Accordingly, in the present invention, there is no latch phase problem in interfacing outside the array. Further, the ABIST does not have to know or compensate for the different phases of the different arrays.

Still in one embodiment of the present invention, a non-scan latch K0 is added outside of the K array which is clocked at the rising edge of the clock. Scan/hold signals, i.e. Scan1/Hold1, to the K array is from the output of the non-scan latch K0.

Further in one embodiment of the present invention, the K array includes a MUX (multiplexer) which is controlled by a scan/hold/enable controller. The scan/hold/enable controller selects the functional, scan, or feedback data.

Yet in one embodiment of the present invention, the K array includes a MUX (multiplexer) which is controlled by an ABIST controller. The ABIST controller determines whether an ABIST is performed.

Still in one embodiment of the present invention, the K array includes a clock controller which determines whether the array is activated for an operation whether it is a scan operation, or a functional operation, etc.

One advantage of the present invention is that it provides a common SRAM design that can be used for both SRAM applications, e.g. Dcache & Icache. There is no need to design two similar arrays that are clocked on either clock phase. Thus, the present invention significantly reduces the design size and cost.

These and other features and advantages of the present invention will become readily apparent to those skilled in the art from the following detailed description and corresponding drawings. As will be realized, the invention is capable of modification without departing from the invention. Accordingly, the drawing and description are to be regarded as illustrative in nature, and not as restrictive.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

The present invention relates generally to a functional unit in a single clock chip design that contains a scan path. More particularly, the present invention relates to an SRAM in a single clock chip design that contains a scan path which can be clocked on either rising edge or falling edge of the clock.

In the following description of the exemplary embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

Figure 2A:
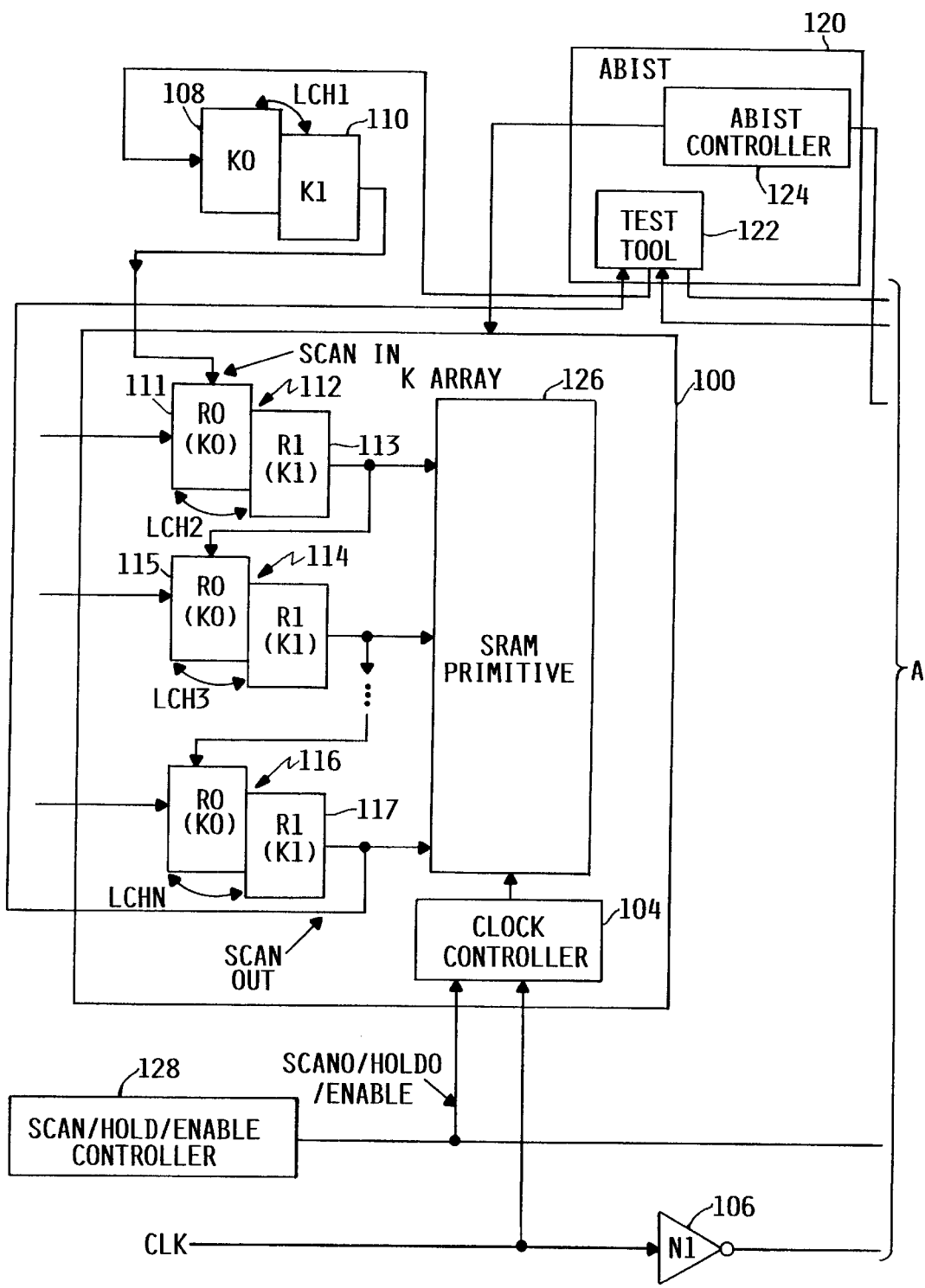
FIG. 2 is a block diagram of an SRAM design in a single clock environment where a single array K is used for SRAM applications clocked on different clock phases in accordance with the present invention.
Figure 2B:
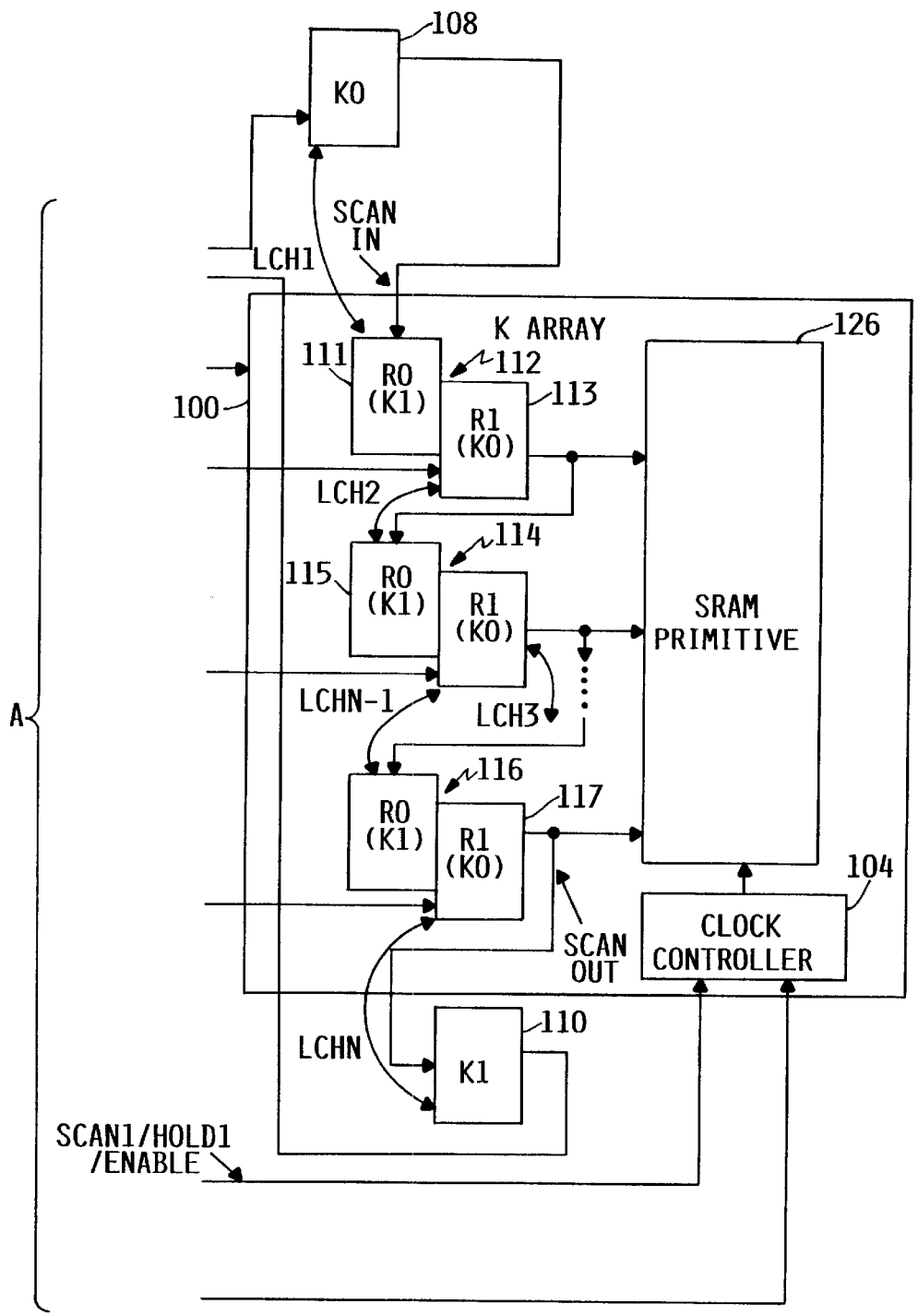

Referring to FIG. 2, there are generally illustrated by reference numeral 100, K array clocked on either a rising edge or a falling edge of the clock in accordance with the principles of the present invention. In one SRAM application, clock signals, CLK, are sent to a clock controller 104 to enable the K array 100. In another SRAM application, the inverted clock signals, −CLK, via an inverter N1 106, are sent to a clock controller 104 to enable the K array 100.

Figure 1B:
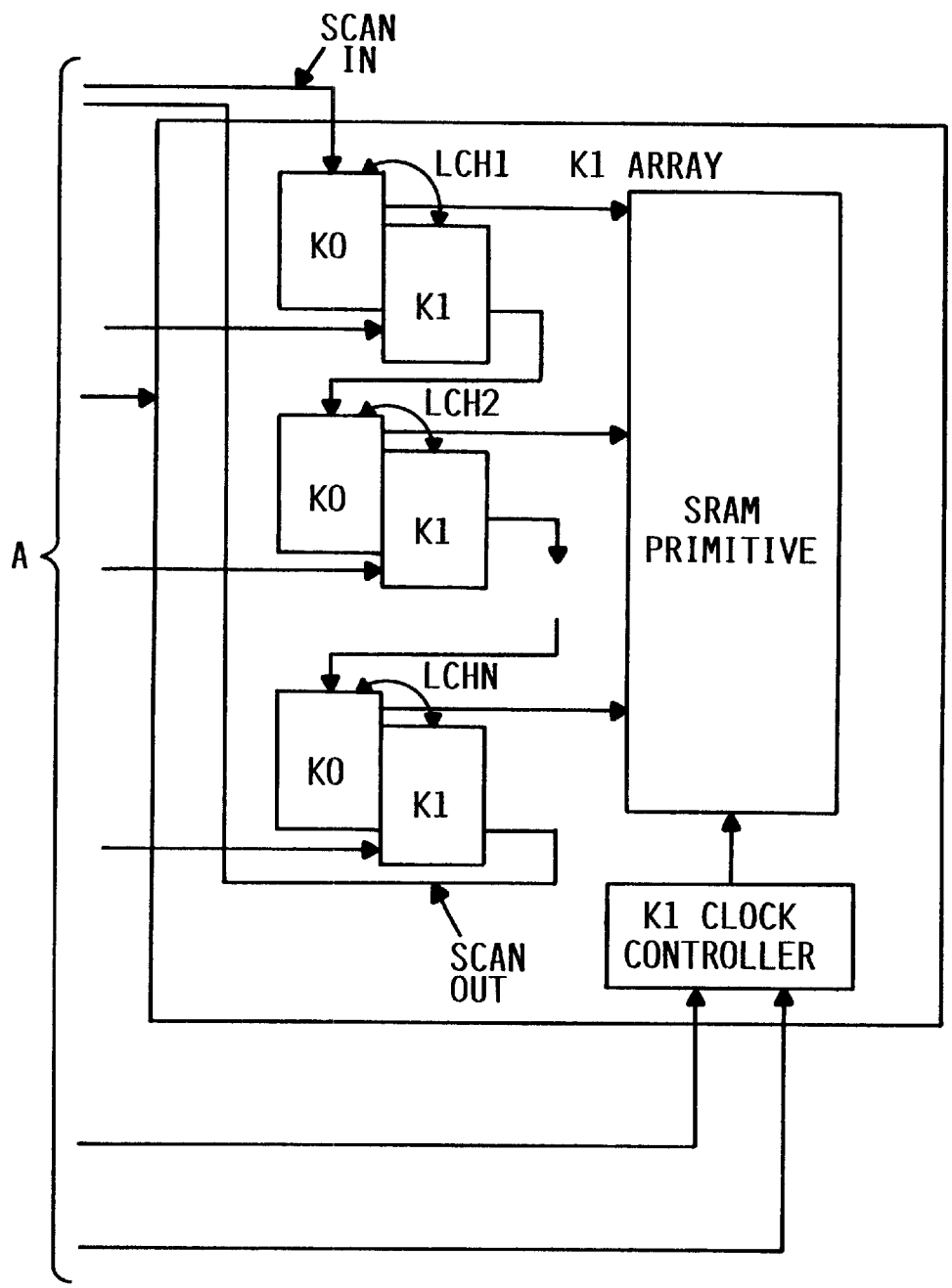
FIG. 1 is a block diagram of a traditional SRAM design in a single clock environment where two similar arrays, K0 and K1, are used for SRAM applications clocked on different clock phases.

It is appreciated that only the scan paths for the K array 100 are shown in FIG. 2. The K array 100 has a set of scan latches LCH2, LCH3. . . LCHN−1, LCHN. Each of the scan latches are formed by scan latch pairs R0/R1. K0/K1 are marked in ( ) for illustration and comparison to those in FIG. 1.

Two scan latches K0,K1 108,110 are added outside the K array 100. When the array is clocked at the rising edge of the clock, the K0,K1 latches 108,110 are connected to the array 100 at the Scan-in side and form a scan latch pair LCH1. When the array is clocked at the falling edge of the clock, the K0 latch 108 is connected to the array 100 at the Scan-in side, and the K1 latch 110 is connected to the array 100 at the Scan-out side. The K0 latch 108 and a R0 (K1) latch 111 of the first latch pair 112 form the scan latch pair LCH1. The R1 (K0) latch 113 of the first latch pair 112 and the R0(K1) latch 115 of the second latch pair 114 form the scan latch pair LCH2. The scan chain goes on and on to LCHN. The R1 (K0) latch 117 of the last latch pair 116 and the scan latch K1 110 form the scan latch pair LCHN. Accordingly, K0 108 and K1 110 allow the array 100 to have a continuous latch phase (i.e. K0/K1/K0/K1) in interfacing outside the array 100 at either clock phase.

Further in FIG. 2, an ABIST 120 includes a test tool 122. The test tool 122 can be used for ABIST, LBIST (Logic Built-in Scan Test), JTAG (Joint Test Action Group), or other suitable tests. The test tool 122 sends an ABIST Scan-in data to the latch pair LCH1 and receives an ABIST Scan-out data from the latch pair LCHN. Generally, the tested data is compared to the expected data so as to determine the accuracy of the chip design and the performance thereof. The ABIST 120 also includes an ABIST controller 124 which controls whether the ABIST test is performed. In the preferred embodiment, the ABIST 120 does not differentiate or compensate for different arrays which are clocked in different phases, i.e. clocked at the rising edge or at the falling edge. It is appreciated that other types of ABIST or test tools can be used within the principles of the present invention.

In FIG. 2, the functional unit, such as an SRAM primitive 126, can be operated in a scan mode, a hold mode, an ABIST test mode, and a functional mode. In the ABIST test mode or the functional mode, the SRAM primitive 126 is accessed for read/write operations. In the scan mode or the hold mode, the SRAM primitive 126 is not accessed for the read/write operations, but the data is feedback to be latched and scanned out. It is appreciated that the details of the SRAM primitive 126 and its read/write operation are well known in the art.

Figure 5A:
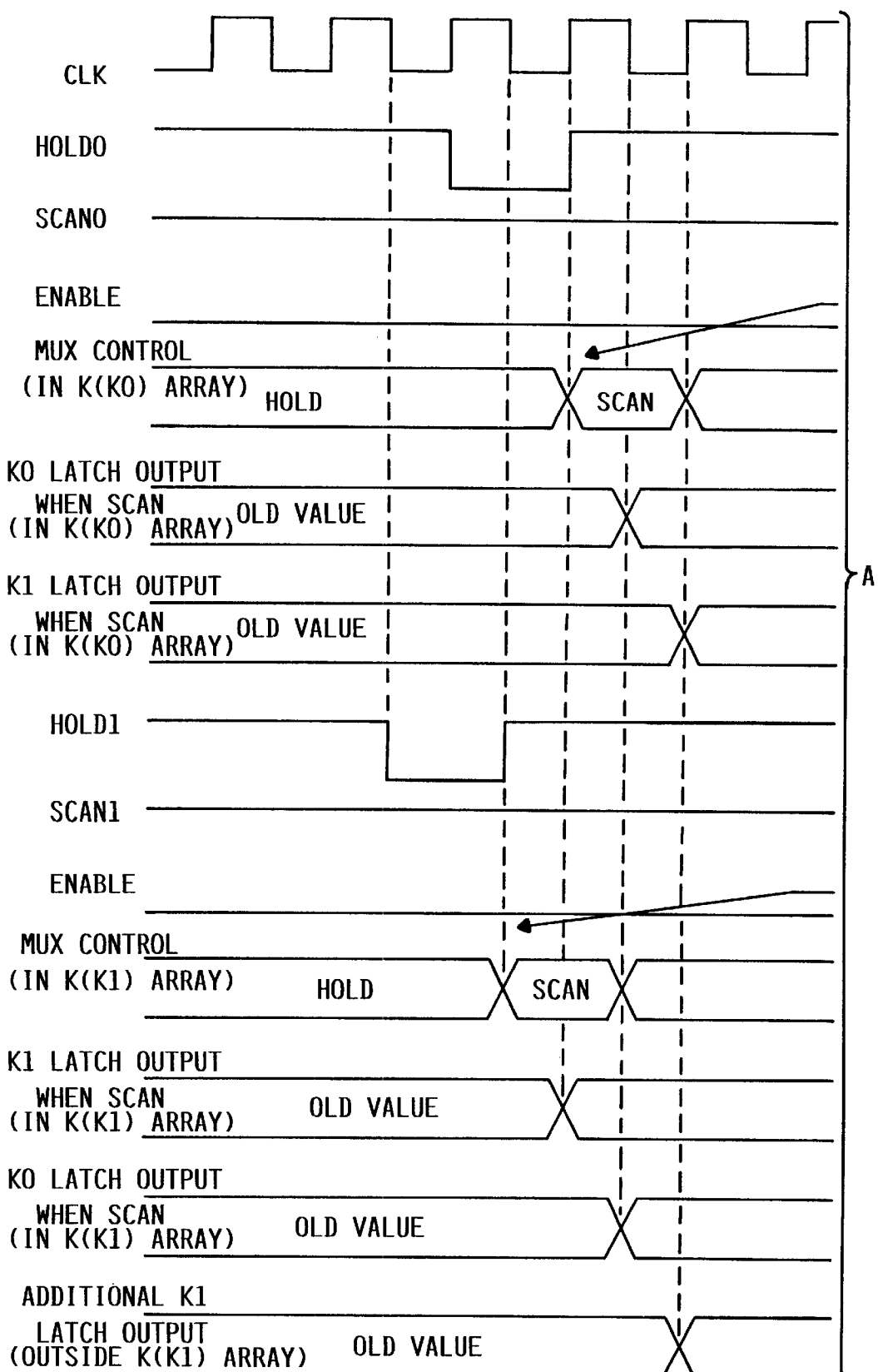
FIG. 5 is a waveform diagram of the array in a scan/hold mode in accordance with the present invention which is clocked on either clock phase.
Figure 5B:
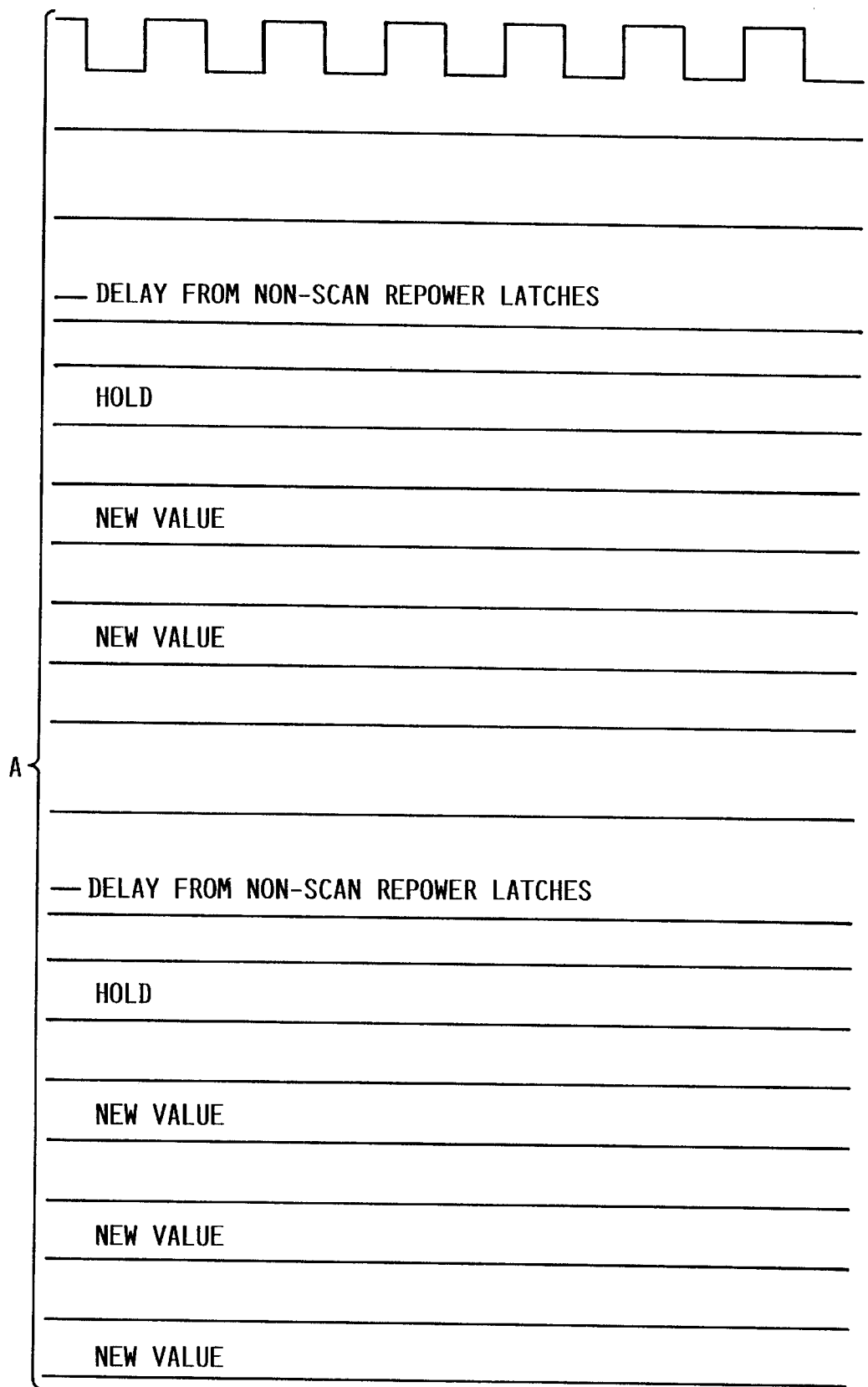
Figure 6A:
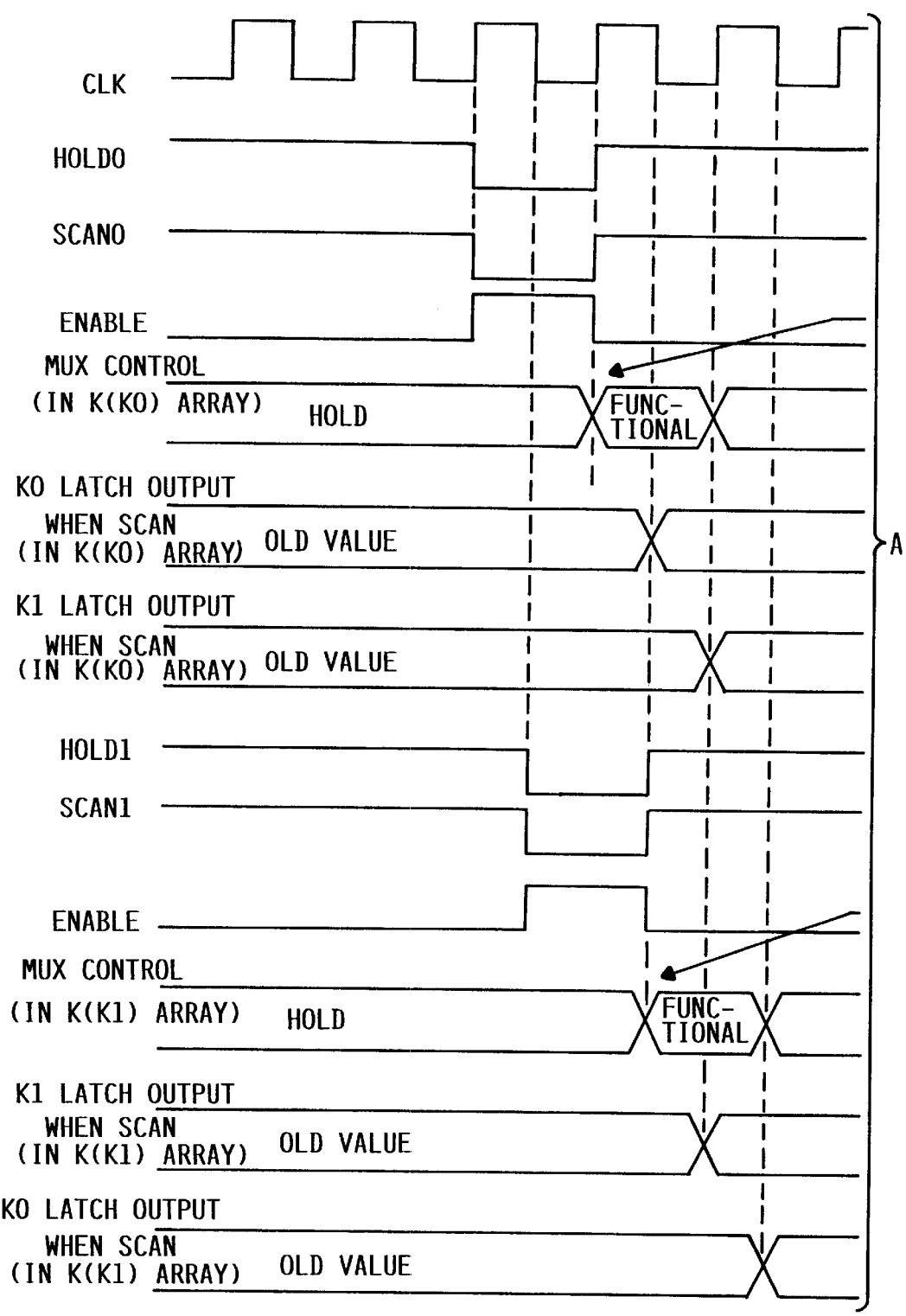
FIG. 6 is a waveform diagram of the array in an ABIST/functional mode in accordance with the present invention which is clocked on either clock phase.
Figure 6B:
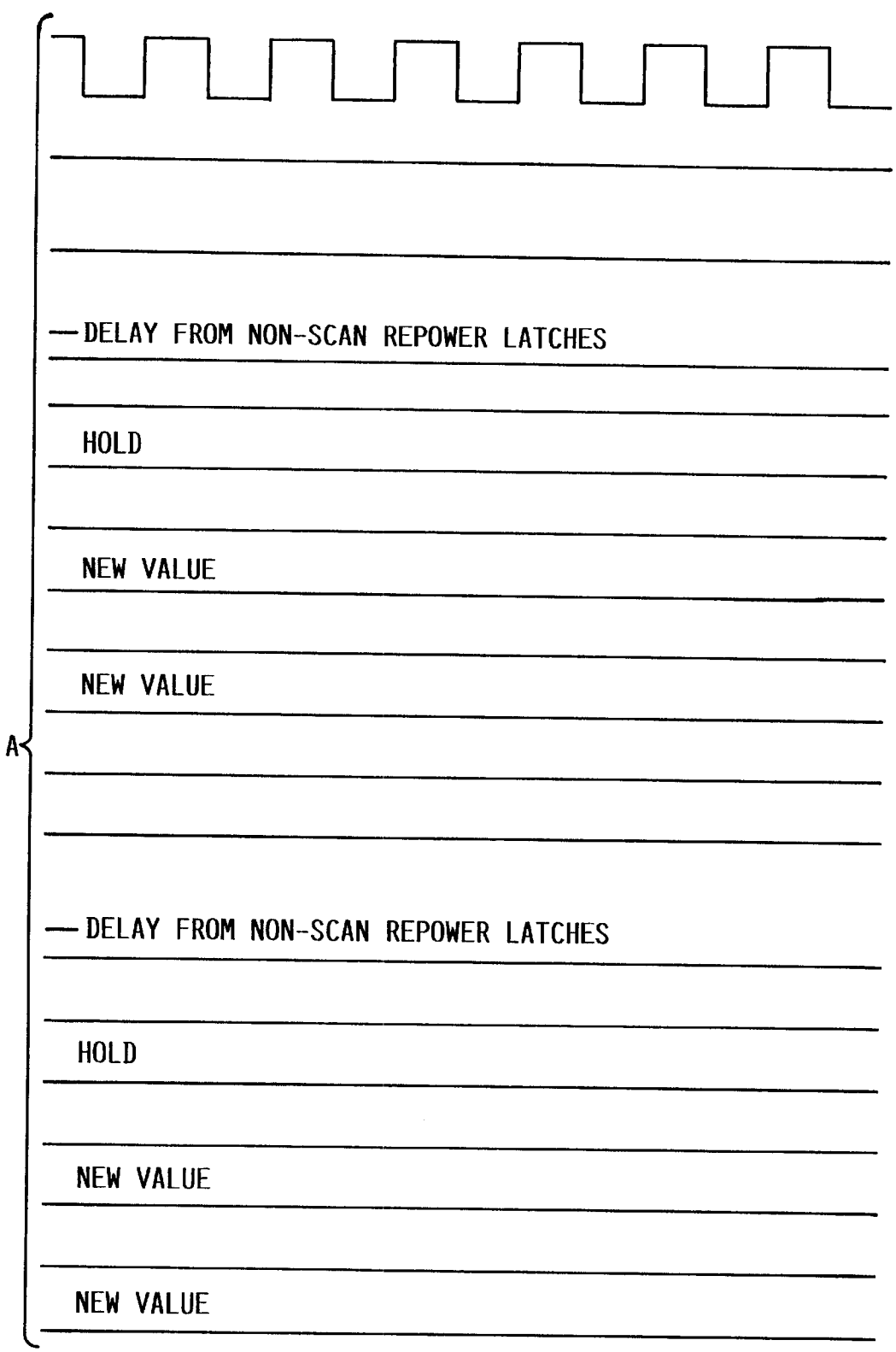

Also shown in FIG. 2, a scan/hold/enable controller 128 sends control signals to the clock controller 104. The scan/hole/enable controller 128 selects a functional, scan, or feedback data in the functional/ABIST test mode, scan mode, or the hold mode, respectively. When the array 100 is clocked at the rising edge of the clock, the scan/hold/enable control signals are scan0/hold0/enable. When the array 100 is clocked at the falling edge of the clock, the scan/hold/enable control signals are scan1/hold1/enable. The details of the scan0/hold0/enable and the scan1/hold1/enable are illustrated in FIGS. 5 and 6. In a scan/hold mode, scan1/hold1/enable control signals lead scan0/hold0/enable control signals by a half clock cycle. In an ABIST/functional mode, scan1/hold1/enable control signals trail scan0/hold0/enable control signals by a half clock cycle.

Figure 3A:
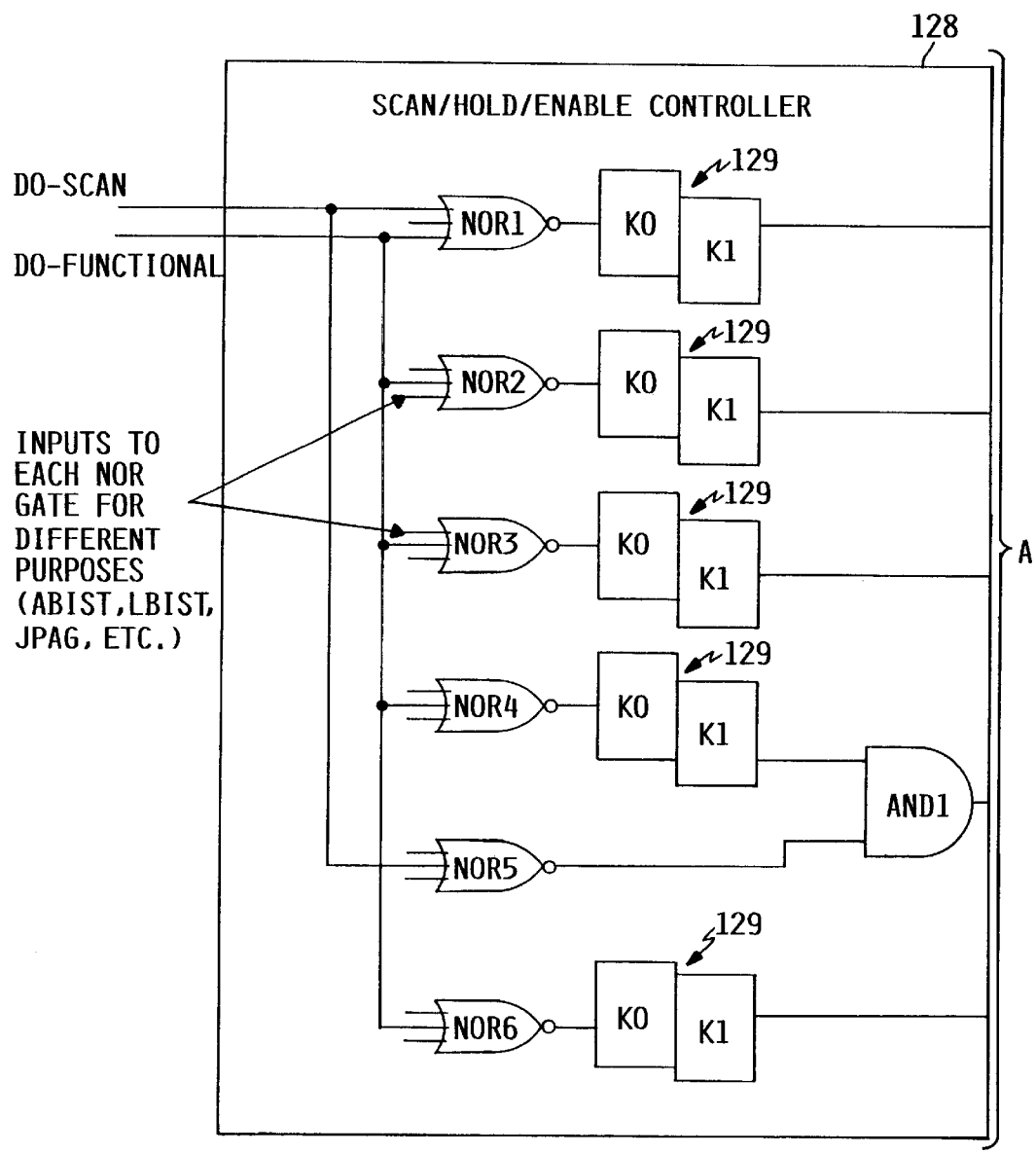
FIG. 3 is a block diagram of control logic of a scan/hold/enable controller and a clock controller in accordance with the present invention.
Figure 3B:
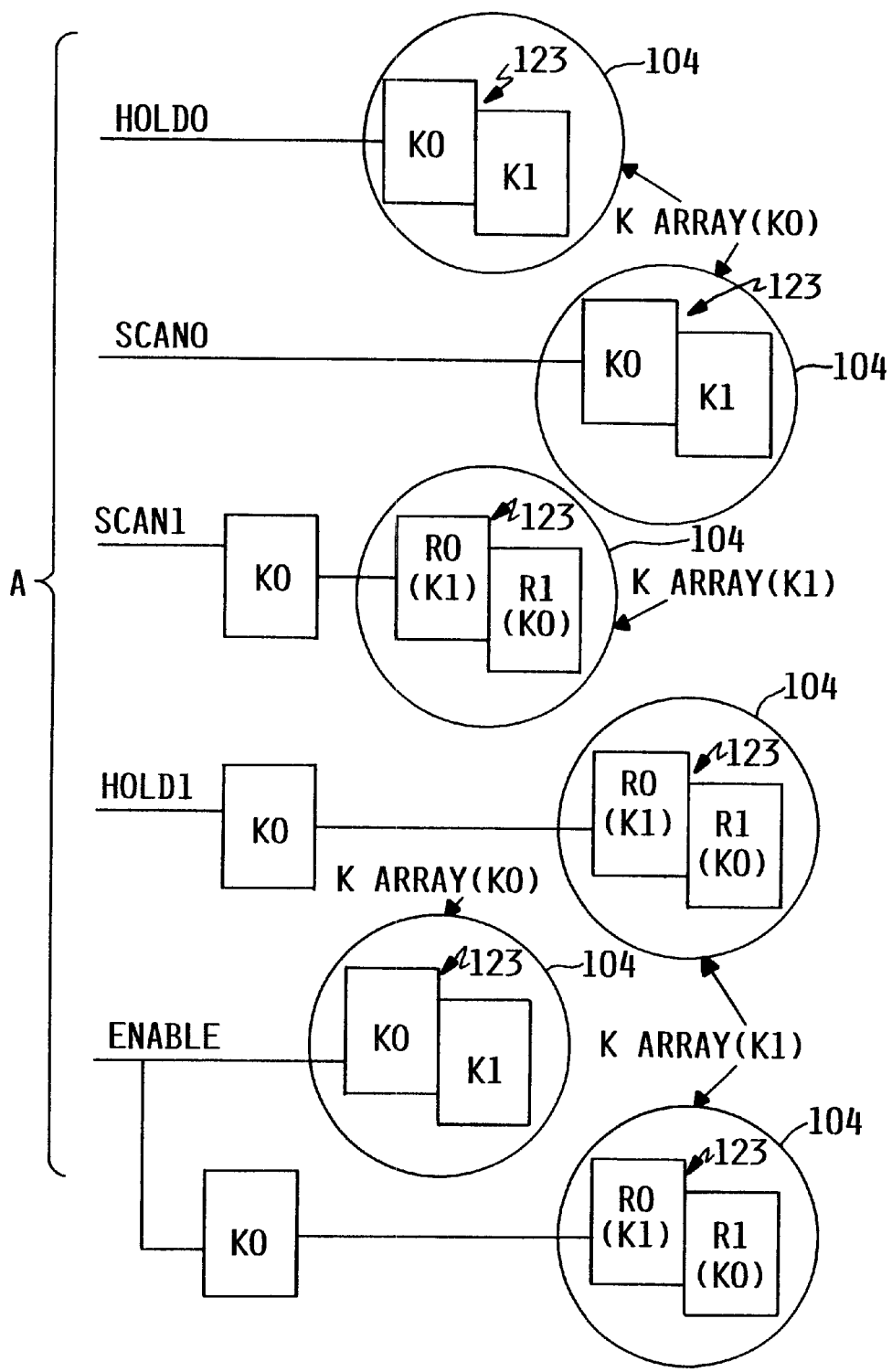

FIG. 3 illustrates control logic of the scan/hold/enable controller 128 in accordance with the present invention. In a scan mode, i.e. DO-SCAN is logic "1", and DO-FUNCTIONAL is logic "0", a scan operation is performed as shown in FIG. 5. In a hold mode, i.e. DO-SCAN is logic "0", and DO-FUNCTIONAL is logic "0", a hold operation is performed as shown in FIG. 5. In an ABIST test mode or a functional mode, i.e. DO-SCAN is logic "0", and DO-FUNCTIONAL is logic "1", an ABIST operation or a functional operation is performed as shown in FIG. 6. The control signals from NOR1, NOR2, NOR3, NOR4, and NOR6 gates are latched by two non-scan latches 129 in the scan/hold/enable controller 128 wherein the non-scan latches 129 help generate original control signals. Also, the control signals from the controller 128 are latched by two non-scan repower latches K0/K1 (or R0/R1) 123 in the clock controller 104. The control signals from the NOR4 and NOR5 are ANDed at a AND1 such that the Hold1 control signals lead the Hold0 control signals by half a clock cycle in a scan/hold operation and trail the Hold0 control signals by half a clock cycle in an ABIST/functional operation.

Also shown in FIG. 3, when the K array 100 is clocked at the falling edge of the clock, the control signals scan1/hold1/enable are sent to a non-scan latch K0 to interface the clock controller 104 of the K array 100 before they are sent to the K array 100.

Figure 4:
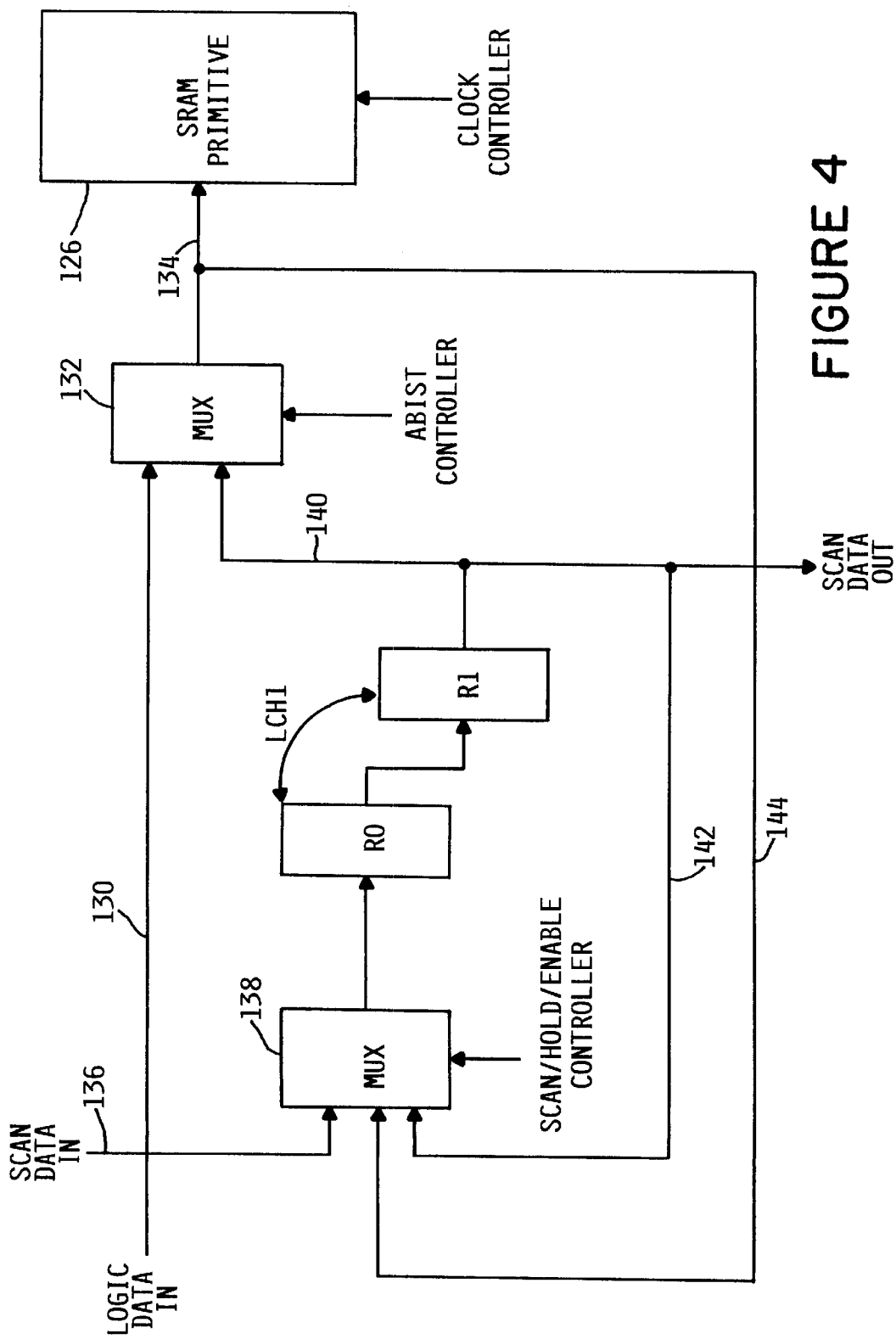
FIG. 4 is a block diagram of one scan bit for an array in accordance with the present invention which can be operated in a scan mode, a hold mode, an ABIST test mode, and a functional mode.

FIG. 4 shows a simple example of K array 100, i.e. one scan bit for the K array, in accordance with the present invention, which can be operated in a scan mode, a hold mode, an ABIST mode, and a functional mode. The ABIST controller line controls whether an ABIST operation or a functional operation is performed. The scan/hold/enable controller line controls whether a scan operation or a hold operation is performed. Functional data, LOGIC DATA IN, on line 130 is inputted into a MUX 132. When the ABIST controller 124 decides to perform a functional operation, the MUX 132 allows the functional data to be sent to the SRAM primitive 126 via line 134. When the ABIST controller 124 decides to perform an ABIST operation, the MUX 132 allows data on line 140 to pass to line 134 and to the SRAM primitive 126. Further, line 144 allows the data from MUX 132 to be feedback to a MUX 138 for a data capture operation. After a clock cycle, the captured data can be scanned out from the latch pair LCH1 to the next latch pair LCH2. The capture operation can be used to determine whether the functional unit, such as MUX 132, etc. works properly. When the scan/hold/enable controller 128 decides to scan, a MUX 138 allows the data from line 136 to be sent to line 140 via the latch pair LCH1 and then to SCAN DATA OUT line. For clarity, MUXes 138, 132 are not shown in the scan paths of FIG. 2. The scan-out data from K1 is sent to the next scan latch pair LCH2 as shown in FIG. 2. When the scan/hold/enable controller 128 decides to hold, the MUX 138 selects a feedback line 142 such that the data at the output of the MUX 138 remains the same, e.g. the "old value" or "new value" as shown in FIGS. 5 and 6.

FIG. 5 shows a waveform diagram of the K array 100 in different clock phases, i.e. the rising edge of the clock and the falling edge of the clock, in a scan operation. At the rising edge of the clock (the third clock cycle), the Scan0/Hold0/enable control signals activate a scan operation. Due to the delay from the non-scan repower latches K0/K1 123 (see FIG. 3), the scan operation is actually started a clock cycle later. The data output of the R0(K0) latch of the latch pair 116 is updated from "old value" to "new value" a half clock cycle after the scan operation starts to perform. The data output of the R1(K1) latch of the latch pair 116 is updated from "old value" to "new value" a full clock cycle after the scan operation starts to perform.

At the falling edge of the clock (two and half clock cycle), the Scan1/Hold1/enable control signals activate a scan operation. Similarly, due to the delay from the non-scan repower latches K0/K1 123 (see FIG. 3), the scan operation is actually started a clock cycle later. The data output of the R0(K1) latch of the latch pair 116 is updated from "old value" to "new value" a half clock cycle after the scan operation starts to perform. The data output of the R1(K0) latch of the latch pair 116 is updated from "old value" to "new value" a full clock cycle after the scan operation starts to perform. Further, the data output of the K1 latch 110 is updated from "old value" to "new value" a clock cycle and a half after the scan operation starts to perform.

FIG. 6 shows a waveform diagram of the K array 100 in different clock phases, i.e. the rising edge of the clock and the falling edge of the clock, in a functional operation. At the rising edge of the clock (the third clock cycle), the Scan0/Hold0/enable control signals activate a functional operation. Due to the delay from the non-scan repower latches K0/K1 123 (see FIG. 3), the functional operation is actually started a clock cycle later. The data output of the R0(K0) latch of the latch pair 116 (FIG. 2) is updated from "old value" to "new value" a half clock cycle after the functional operation starts to perform. The data output of the R1(K1) latch of the latch pair 116 is updated from "old value" to "new value" a full clock cycle after the functional operation starts to perform.

At the falling edge of the clock (two and half clock cycle), the Scan1/Hold1/enable control signals activate a functional operation. Similarly, due to the delay from the non-scan repower latches K0/K1 123 (see FIG. 3), the functional operation is actually started a clock cycle later. The data output of the R0(K1) latch of the latch pair 116 is updated from "old value" to "new value" a half clock cycle after the functional operation starts to perform. The data output of the R1(K0) latch of the latch pair 116 is updated from "old value" to "new value" a full clock cycle after the functional operation starts to perform.

The present invention has been described in its presently contemplated best mode, and it is clear that it is susceptible to various modifications, modes of operation and embodiments, all within the ability and skill of those skilled in the art and without the exercise of further inventive activity. Further, while the invention has been described in connection with what is presently considered the most practical and preferred embodiments, it is to be understood that the invention is not limited to the disclosed embodiments, but on the contrary, is intended to cover various modifications and equivalent arrangements included within the spirit and scope of the appended claims.

What is claimed is:

1. An SRAM comprising:
   a. a clock signal having two phases;
   b. a scan/hold/enable controller which generates a first selection signal;
   c. an ABIST controller which generates a second selection signal;
   d. a plurality of first multiplexers responsive to the first selection signal, wherein each of the first multiplexers selects as an output one of a scan data in signal, a hold signal, and a data capture feedback signal;
   e. a plurality of latches that can be clocked on either of the two phases of the clock signal and which receive as data the outputs of the first multiplexers; and
   f. a plurality of second multiplexers responsive to the second selection signal, wherein each of the second multiplexers selects either of a logic data-in signal or an output from the plurality of latches;
   wherein the first selection signal is latched by non-scan repower latches.

2. The SRAM of claim 1, wherein a test tool sends scan-in data from a scan-out port to the plurality of the latches and receives scan-out data from the plurality of latches into a scan-in port.

3. The SRAM of claim 2, wherein the plurality of latches includes a plurality of K0/K1 latch pairs, neighboring K0/K1 pairs being latched in an order of K0/K1—K0/K1 in either one of the two phases of the clock signal.

4. The SRAM of claim 3, wherein the SRAM includes an auxiliary scan latch pair consisting of a K0 portion and a K1 portion.

5. The SRAM of claim 4, wherein the auxiliary scan latch pair is coupled between the scan-out port of the test tool and a scan input of a first scan latch of the plurality of K0/K1 pairs, wherein the plurality of K0/K1 latch pairs are responsive to a rising clock.

6. The SRAM of claim 4, wherein the K0 portion of the auxiliary scan latch pair is coupled to the scan-out port of the test tool and a scan input of a first scan latch pair in the plurality of K0/K1 pairs, and wherein the K1 portion of the auxiliary scan latch pair is coupled to a scan output of a last scan latch in the plurality of K0/K1 pairs and the scan-in port of the test tool, wherein the plurality of K0/K1 latch pairs are responsive to a falling clock.

7. The SRAM of claim 1, wherein during the scanning, a first selection signal of the scan/hold/enable controller in one of the two phases of the clock signal leads a second selection signal of the scan/hold/enable controller in the other phase by half a clock cycle.

8. The SRAM of claim 7, wherein during a functional operation, the first selection signal of the scan/hold/enable controller trails the second selection signal by half a clock cycle.

9. A functional unit operated in at least two clock phases, comprising:
   a. a clock signal having the at least two clock phases;
   b. a scan/hold/enable controller which generates a first selection signal;
   c. an ABIST controller which generates a second selection signal;
   d. a plurality of first multiplexers responsive to the first selection signal, wherein each of the first multiplexers selects as an output one of a scan data in signal, a hold signal, and a data capture feedback signal; and
   e. a plurality of latches that can be clocked on either of the at least two clock phases and which receive as data the outputs of the first multiplexers;
   wherein the first selection signal is latched by non-scan repower latches.

10. The functional unit of claim 9, wherein a test tool sends scan-in data to the plurality of the latches and receives scan-out data from the plurality of latches.

11. The functional unit of claim 9, wherein the plurality of latches includes a plurality of K0/K1 latch pairs, neighboring K0/K1 pairs being latched in an order of K0/K1—K0/K1 in either one of the two phases of the clock signal.

12. The functional unit of claim 9, wherein during the scanning, a first selection signal of the scan/hold/enable controller in one of the two phases of the clock signal leads a second selection signal of the scan/hold/enable controller in the other phase by half a clock cycle.

13. The functional unit of claim 12, wherein during a functional operation, the first selection signal of the scan/hold/enable controller trails the second selection signal by half a clock cycle.

* * * * *